(12) United States Patent
Yamashita et al.

(10) Patent No.: US 10,386,950 B2
(45) Date of Patent: Aug. 20, 2019

(54) TOUCH-PANEL-EQUIPPED DISPLAY DEVICE AND METHOD FOR MANUFACTURING TOUCH-PANEL-EQUIPPED DISPLAY DEVICE

(71) Applicant: SHARP KABUSHIKI KAISHA, Sakai, Osaka (JP)

(72) Inventors: Tetsuya Yamashita, Sakai (JP); Yoshimasa Chikama, Sakai (JP); Yoshihito Hara, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/746,561

(22) PCT Filed: Jul. 21, 2016

(86) PCT No.: PCT/JP2016/071344
§ 371 (c)(1),
(2) Date: Jan. 22, 2018

(87) PCT Pub. No.: WO2017/014252
PCT Pub. Date: Jan. 26, 2017

(65) Prior Publication Data
US 2019/0004647 A1 Jan. 3, 2019

(30) Foreign Application Priority Data
Jul. 22, 2015 (JP) .................................. 2015-145097

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G03B 17/02* (2013.01);
(Continued)

(58) Field of Classification Search
CPC .. G02F 1/13338; G06F 3/0412; G06F 3/0416; G06F 3/044; G06F 2203/04103;
(Continued)

(56) References Cited

U.S. PATENT DOCUMENTS

2004/0233175 A1* 11/2004 Chuang .................... G06F 3/045
345/173
2008/0164810 A1* 7/2008 Oda ..................... H01L 27/3246
313/504
(Continued)

FOREIGN PATENT DOCUMENTS

| JP | 4816668 B2 | 11/2011 |
|---|---|---|
| JP | 2016-126778 A | 7/2016 |

(Continued)

*Primary Examiner* — Stephen G Sherman
(74) *Attorney, Agent, or Firm* — ScienBiziP, P.C.

(57) ABSTRACT

A touch-panel-equipped display device includes an active matrix substrate 1, TFTs 4; a first insulating film 44 formed on a liquid crystal layer side with respect to the TFT 4; pixel electrodes 31 provided on a liquid crystal layer side with respect to the first insulating film; a second insulating film 46 provided on a liquid crystal layer side with respect to the pixel electrodes; counter electrodes 21 that are formed on a liquid crystal layer side with respect to the second insulating film, the counter electrodes and the pixel electrodes having electrostatic capacitances therebetween; a control unit that detects a touch position by supplying a touch driving signal to the counter electrodes; and signal lines 22 for supplying the touch driving signal from the control unit to the counter electrodes. The signal lines are formed between the first insulating film and the second insulating film.

16 Claims, 11 Drawing Sheets

(51) Int. Cl.
*H01L 27/12* (2006.01)
*G03B 17/02* (2006.01)
*G03B 17/18* (2006.01)
*G06F 3/044* (2006.01)

(52) U.S. Cl.
CPC ............. *G03B 17/18* (2013.01); *G06F 3/044* (2013.01); *G06F 3/0416* (2013.01); *H01L 27/127* (2013.01); *H01L 27/1288* (2013.01); *G06F 2203/04103* (2013.01)

(58) Field of Classification Search
CPC .. G06F 3/041–047; G06F 2203/04101–04113; H01L 27/124; H01L 27/1259–1296
See application file for complete search history.

(56) References Cited

U.S. PATENT DOCUMENTS

| | | | |
|---|---|---|---|
| 2010/0182273 | A1 | 7/2010 | Noguchi et al. |
| 2010/0302227 | A1* | 12/2010 | Sasaki ................. G02F 1/13338 345/211 |
| 2013/0162570 | A1* | 6/2013 | Shin ....................... G06F 3/041 345/173 |
| 2013/0342801 | A1 | 12/2013 | Hamada et al. |
| 2016/0188040 | A1 | 6/2016 | Shin et al. |

FOREIGN PATENT DOCUMENTS

| | | |
|---|---|---|
| WO | 2012/063788 A1 | 5/2012 |
| WO | 2012/118038 A1 | 9/2012 |

\* cited by examiner

TOUCH-PANEL-EQUIPPED DISPLAY DEVICE AND METHOD FOR MANUFACTURING TOUCH-PANEL-EQUIPPED DISPLAY DEVICE

TECHNICAL FIELD

The present invention relates to a touch-panel-equipped display device and a method for manufacturing the same.

BACKGROUND ART

Patent Document 1 discloses a touch-panel-equipped display device that includes an active matrix substrate on which pixel electrodes and reference lines are formed, a counter substrate on which counter electrodes that double as data signal lines are formed, and a liquid crystal layer interposed between the active matrix substrate and the counter substrate. In this touch-panel-equipped display device, signal potentials are applied to the data signal lines, whereby signal potentials are supplied through liquid crystal capacitors to the pixel electrodes, and mutual capacitors are formed between the pixel electrodes and the reference lines. When an object such as a finger touches the display surface of the active matrix substrate, charges of the reference lines fluctuate. By detecting the fluctuations of the charges of the reference lines, the touch position is detected.

PRIOR ART DOCUMENT

Patent Document

Patent Document 1: WO2012/063788

SUMMARY OF THE INVENTION

Problem to be Solved by the Invention

In the case of the touch-panel-equipped display device disclosed in Patent Document 1, however, in which the data signal lines required for touch position detection are provided on the counter substrate side, it is necessary to provide a controller for image display on the active matrix substrate side, and to provide a controller for touch position detection on the counter substrate side, which lead to an increase in the costs.

It is an object of the present invention to provide a touch-panel-equipped display device in which a configuration required for touch position detection is provided on an active matrix substrate, and to provide a method for manufacturing the same.

Means to Solve the Problem

A touch-panel-equipped display device according to one embodiment of the present invention includes an active matrix substrate; a counter substrate opposed to the active matrix substrate; a liquid crystal layer interposed between the active matrix substrate and the counter substrate; a display control element formed on the active matrix substrate; a first insulating film formed on the active matrix substrate, on a liquid crystal layer side with respect to the display control element; a plurality of pixel electrodes formed on the active matrix substrate, on a liquid crystal layer side with respect to the first insulating film; a second insulating film formed on the active matrix substrate, on a liquid crystal layer side with respect to the pixel electrodes; a plurality of counter electrodes formed on the active matrix substrate, on a liquid crystal layer side with respect to the second insulating film, the counter electrodes and the pixel electrodes having electrostatic capacitances therebetween; a control unit provided on the active matrix substrate, the control unit detecting a touch position by supplying a touch driving signal to the counter electrodes; and signal lines for connecting the control unit and the counter electrodes, and supplying the touch driving signal from the control unit to the counter electrodes, wherein the signal lines are formed on the active matrix substrate, between the first insulating film and the second insulating film.

Effect of the Invention

According to the disclosure of the present embodiment, the signal lines, the plurality of counter electrodes, and the control unit required for touch position detection are provided on the active matrix substrate. This makes it possible to provide the controller for image display, and the controller (control unit) for touch position detection, on the active matrix substrate side. This enables, for example, to perform the control for image display and the control for touch position detection with one controller. As a result, as compared with a case where two controllers are provided, the costs can be reduced.

MODE FOR CARRYING OUT THE INVENTION

Figure 1:
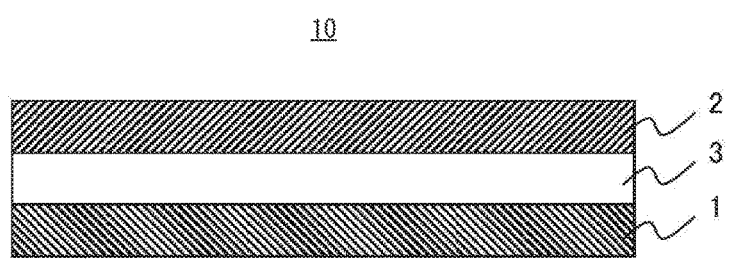
FIG. 1 is a cross-sectional view of a touch-panel-equipped display device in Embodiment 1.

A touch-panel-equipped display device according to one embodiment of the present invention includes an active matrix substrate; a counter substrate opposed to the active matrix substrate; a liquid crystal layer interposed between the active matrix substrate and the counter substrate; a display control element formed on the active matrix substrate; a first insulating film formed on the active matrix substrate, on a liquid crystal layer side with respect to the display control element; a plurality of pixel electrodes formed on the active matrix substrate, on a liquid crystal layer side with respect to the first insulating film; a second insulating film formed on the active matrix substrate, on a liquid crystal layer side with respect to the pixel electrodes; a plurality of counter electrodes formed on the active matrix substrate, on a liquid crystal layer side with respect to the second insulating film, the counter electrodes and the pixel electrodes having electrostatic capacitances therebetween; a control unit provided on the active matrix substrate, the control unit detecting a touch position by supplying a touch driving signal to the counter electrodes; and signal lines for connecting the control unit and the counter electrodes, and supplying the touch driving signal from the control unit to the counter electrodes, wherein the signal lines are formed on the active matrix substrate, between the first insulating film and the second insulating film (the first configuration).

According to the first configuration, the signal lines, the plurality of counter electrodes, and the control unit required for touch position detection are provided on the active matrix substrate, whereby the controller for image display, and the controller (control unit) for touch position detection, can be provided on the side of the active matrix substrate. Accordingly, for example, the control for image display and the control for touch position detection can be performed with one controller, which results in that the costs can be reduced, as compared with a case where two controllers are provided.

If the signal lines are provided on the liquid crystal layer side with respect to the counter electrodes, there is a possibility that a displayed image could be influenced (display noises could occur) during the control for touch position detection, since the liquid crystal layer exists above the counter electrodes. According to the first configuration, however, the signal lines are formed on a side opposite to the liquid crystal layer with respect to the counter electrodes, between the first insulating film and the second insulating film, which enables to suppress influences to a displayed image during the control for touch position detection.

The first configuration may further include a conductive film provided between the signal lines and the first insulating film, the conductive film being made of the same material as a material of the pixel electrodes (the second configuration).

According to the second configuration, the conductive film made of the same material as a material of the pixel electrode is provided between the signal lines and the first insulating film, whereby adhesion between the signal lines and the first insulating film can be improved.

The first or second configuration may be arranged such that the display control element is a thin film transistor, and includes at least a gate electrode, a source electrode, and a drain electrode, and at a position where the pixel electrode is in contact with the drain electrode, the foregoing configuration further includes a metal film provided between the pixel electrode and the second insulating film (the third configuration).

With the third configuration, the pixel electrodes can be protected by the metal film.

Any one of the first to third configurations may be arranged such that the signal lines are in contact with the second insulating film in such a manner that only a portion of a counter electrode side surface of each of the signal lines, on one side of an area in contact with the counter electrode, is in contact with the second insulating film (the fourth configuration).

The fourth configuration allows the superficial area of the interface between the signal lines and the second insulating film to decrease, as compared with a configuration in which portions of the signal lines on both sides of the area thereof in contact with the counter electrode is in contact with the second insulating film. Accordingly, in a case where the adhesion between the signal lines and the second insulating film is poor, the fourth configuration enables to improve the adhesion.

Any one of the first to fourth configurations may further include: a gate line arranged on the active matrix substrate, the gate line extending in a first direction; and a source line arranged on the active matrix substrate, the source line extending in a second direction that is different from the first direction. The configuration may be arranged such that: the control unit is provided on the active matrix substrate, the control unit being electrically connected with the gate line and the source line; and in a terminal part where the control unit is connected to the active matrix substrate, a first metal film made of the same material as a material of the gate line, a second metal film made of the same material as a material of the source line, a first transparent electrode film made of the same material as a material of the pixel electrodes, and a second transparent electrode film made of the same material as a material of the counter electrodes are laminated sequentially on the active matrix substrate (the fifth configuration).

According to the fifth configuration, no metal film made of the same material as a material of the signal lines are formed in the terminal part of the control unit, which allows steps at the laminate to be smaller, thereby making it possible to suppress the breaking of the line.

Any one of the first to fourth configuration may further include: a gate line arranged on the active matrix substrate, the gate line extending in a first direction; and a source line arranged on the active matrix substrate, the source line extending in a second direction that is different from the first direction. The configuration may be arranged such that the control unit is provided on the active matrix substrate, the control unit being electrically connected with the gate line and the source line; and in a terminal part where the control unit is connected to the active matrix substrate, a first metal film made of the same material as a material of the gate line, a second metal film made of the same material as a material of the source line, a first transparent electrode film made of the same material as a material of the pixel electrodes, a metal film made of the same material as a material of the signal line, and a second transparent electrode film made of the same material as a material of the counter electrodes are laminated sequentially on the active matrix substrate (the sixth configuration).

According to the sixth configuration, a metal film made of the same material as a material of the signal lines are also laminated in the terminal part, whereby the resistance in the terminal part can be reduced.

Any one of the first to sixth configurations may further include a flattening film arranged on the active matrix substrate, between the first insulating layer and the pixel electrodes, wherein a surface of the flattening film is treated by plasma treatment (the seventh configuration).

According to the seventh configuration, the surface of the flattening film is subjected to plasma treatment, fine protrusions and recesses can be formed on the surface of the flattening film, which improves adhesion when the transparent electrode film is formed on the flattening film.

Any one of the first to second configurations may be arranged such that in a connection part in which the first metal film made of the same material as a material of the gate line, the second metal film made of the same material as a material of the source line, and the first transparent electrode film made of the same material as a material of the pixel electrodes are laminated sequentially, the signal lines are laminated on the first transparent electrode film, and the signal lines are electrically connected with the control unit through the first metal film or the second metal film (the eighth configuration).

According to the eighth configuration, in the connection part where the first metal film and the second metal film are laminated, the signal lines are connected with either the first metal film or the second metal film through the first transparent electrode film, whereby the resistance in the connection part can be reduced. Accordingly, this makes it possible to suppress a decrease in the signal level when a signal is transmitted/received to/from the signal lines via the connection part.

A method for manufacturing a touch-panel-equipped display device according to one embodiment of the present invention is a method for manufacturing a touch-panel-equipped display device that includes an active matrix substrate, a counter substrate opposed to the active matrix substrate, and a liquid crystal layer interposed between the active matrix substrate and the counter substrate, and that has a function of detecting a touch position. The method includes the steps of: forming a display control element on the active matrix substrate; after the display control element is formed, forming a first insulating film so that the first insulating film covers the display control element; after the first insulating film is formed, forming a flattening film so that the flattening film covers the first insulating film; performing plasma treatment to an exposed surface after the flattening film is formed; after the plasma treatment is performed, forming a transparent electrode film for forming pixel electrodes; after the transparent electrode film is formed, forming a metal film for forming signal lines for supplying a touch driving signal; after the metal film is formed, forming a second insulating film; and after the second insulating film is formed, forming counter electrodes that are electrically connected with the signal lines (the ninth configuration).

According to the ninth configuration, the signal lines, the plurality of counter electrodes, and the control unit required for touch position detection are provided on the active matrix substrate, whereby the controller for image display and the controller (the control unit) for touch position detection can be provided on the side of the active matrix substrate. This enables, for example, to perform the control for image display and the control for touch position detection with one controller. As a result, as compared with a case where two controllers are provided, the costs can be reduced. Besides, since the surface exposed after the flattening film is formed is subjected to plasma treatment, fine protrusions and recesses can be formed on the exposed surface, which improves adhesion when the transparent electrode film is formed on the surface of the flattening film and the like.

The ninth configuration may be further arranged such that the transparent electrode film is formed at least in an area where the pixel electrodes are to be formed and an area where the signal lines are to be formed, and the signal lines are formed by forming the metal film on the transparent electrode film formed in the area where the signal lines are to be formed (the tenth configuration).

According to the tenth configuration, the metal film for forming the signal lines are formed on the transparent electrode film. Therefore, as compared with a case where the metal film for forming the signal lines are formed on the flattening film, the adhesion between the signal lines and the flattening film can be improved. Further, since the transparent electrode film is formed in the area where the signal lines are to be formed, at the same step when the pixel electrodes are formed, this does not involve a significant increase in the number of manufacturing steps.

The ninth or tenth configuration may be arranged such that when forming the transparent electrode film, the transparent electrode film is formed also in an area other than the area where the pixel electrodes are to be formed, and when forming the metal film, the metal film is formed on the transparent electrode film, also in an area other than the area where the signal lines are to be formed. The method for manufacturing a touch-panel-equipped display device may further include the steps of: forming a first mask in the area where the pixel electrodes are to be formed, and in the area where the signal lines are to be formed; after the first mask is formed, removing a portion of the transparent electrode film and the metal film that is not covered with the first mask, by etching; after the portion of the transparent electrode film and the metal film is removed, removing the first mask; after the first mask is removed, forming a second mask in the area where the signal lines are to be formed; after the second mask is formed, removing a portion of the metal film that is not covered with the second mask, by etching; and after the portion of the metal film is removed, removing the second mask. By doing so, the pixel electrodes are formed in the area where the pixel electrodes are to be formed, and the signal lines are formed in the area where the signal lines are to be formed (the eleventh configuration).

Any one of the ninth to eleventh configuration may be further arranged such that the display control element is a thin film transistor and includes at least a gate electrode, a source electrode, and a drain electrode, and the method for manufacturing a touch-panel-equipped display device may further include the steps of: forming a hole in the flattening film; and at a position where the hole is formed in the flattening film, forming a hole in the first insulating film, wherein, when forming the transparent electrode film for forming the pixel electrodes, the transparent electrode film is formed so that the pixel electrode formed is in contact with the drain electrode at the position where the hole in the flattening film and the hole in the first insulating film are formed (the twelfth configuration).

EMBODIMENT

The following description describes embodiments of the present invention in detail, while referring to the drawings.

Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

FIG. 1 is a cross-sectional view of a touch-panel-equipped display device 10 in one embodiment. The touch-panel-equipped display device 10 in one embodiment includes an active matrix substrate 1, a counter substrate 2, and a liquid crystal layer 3 interposed between the active matrix substrate 1 and the counter substrate 2. Each of the active matrix substrate 1 and the counter substrate 2 includes a glass substrate that is substantially transparent (has a high translucency). The counter substrate 2 includes color filters that are not illustrated. Further, though the illustration is omitted, this touch-panel-equipped display device 10 includes a backlight.

The touch-panel-equipped display device 10 of the present embodiment has a function of displaying an image, and at the same time, has a function of detecting position information (touch position) input by a user based on the displayed image. This touch-panel-equipped display device 10 includes a so-called in-cell type touch panel in which lines and the like that are required for detecting a touch position are formed in a display panel.

In the case of the touch-panel-equipped display device 10 in the present embodiment, liquid crystal molecules contained in the liquid crystal layer 3 is driven in the in-plane switching mode. In order to realize the in-plane switching mode, pixel electrodes and counter electrodes (referred to as "common electrodes" in some cases) for forming an electric field are formed on the active matrix substrate 1.

Figure 2:
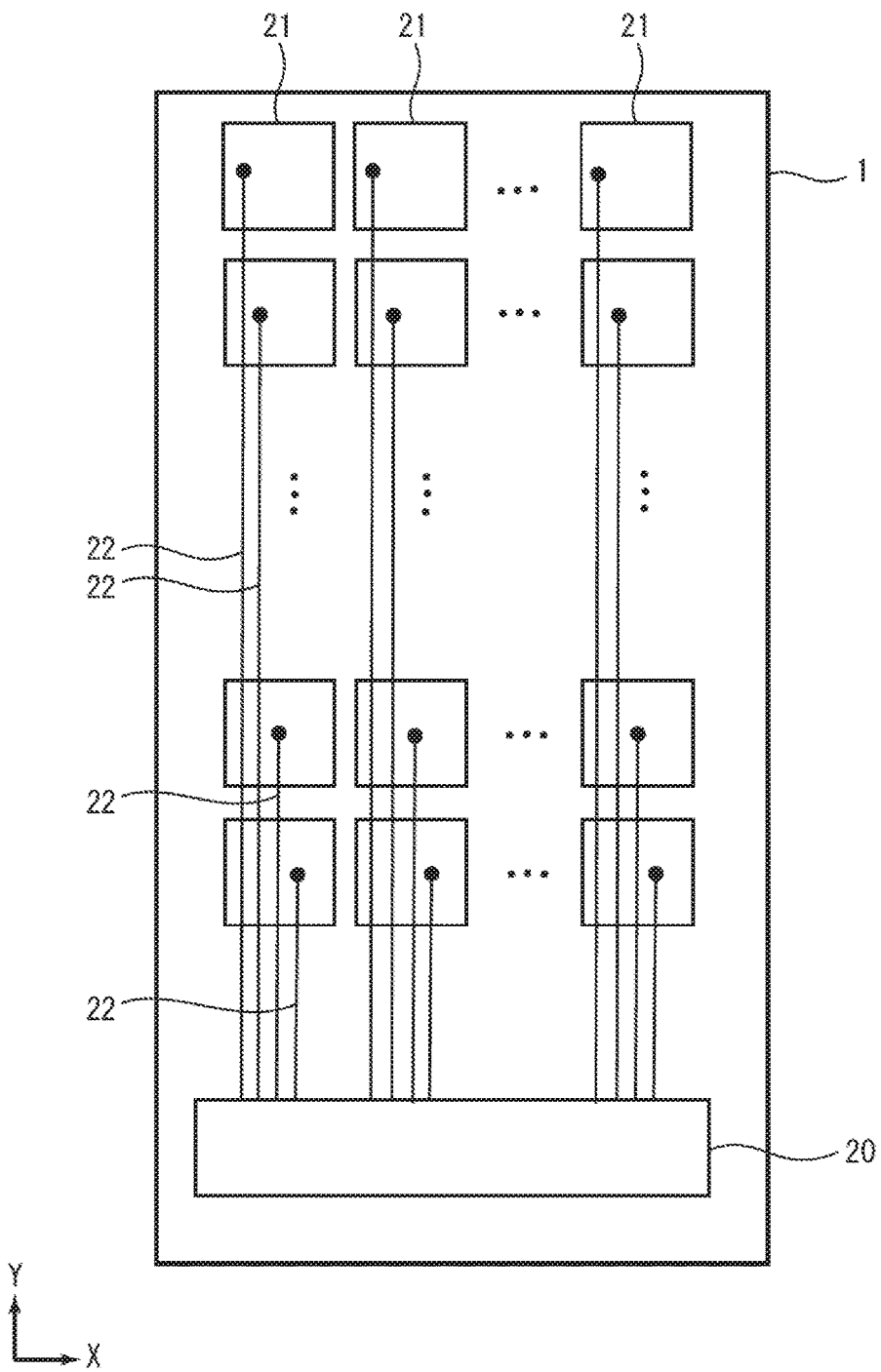
FIG. 2 illustrates an exemplary arrangement of counter electrodes formed on an active matrix substrate.

FIG. 2 illustrates an exemplary arrangement of counter electrodes 21 formed on the active matrix substrate 1. The counter electrodes 21 are formed on a surface on the liquid crystal layer 3 side of the active matrix substrate 1. As illustrated in FIG. 2, the counter electrode 21 is in a rectangular shape, and a plurality of the counter electrodes 21 are arranged in matrix on the active matrix substrate 1.

On the active matrix substrate 1, a controller 20 is provided. The controller 20 performs a controlling operation for displaying an image, and at the same time performs a controlling operation for touch position detection.

The controller 20 and each counter electrodes 21 are connected by signal lines 22 extending in the Y axis direction. More specifically, the same number of the signal lines 22 as the number of the counter electrodes 21 are formed on the active matrix substrate 1.

In the touch-panel-equipped display device 10 in the present embodiment, the counter electrodes 21 are used, in pairs with the pixel electrodes, when image display is controlled, and are also used during the control for touch position detection.

Regarding the counter electrodes 21, parasitic capacitors are formed between the same and adjacent ones of the counter electrodes 21 or the like. When a human finger or the like touches the display screen of the display device 10, capacitors are formed between the human finger or the like, and electrostatic capacitances increase. During the control for touch position detection, the controller 20 supplies a touch driving signal to the counter electrodes 21 through the signal lines 22, and receives a touch detection signal through the signal lines 22. By doing so, the controller 20 detects a change in the electrostatic capacitances, and detects a touch position. In other words, the signal lines 22 function as lines for the transmission/reception of the touch driving signal and the touch detection signal.

Figure 3:
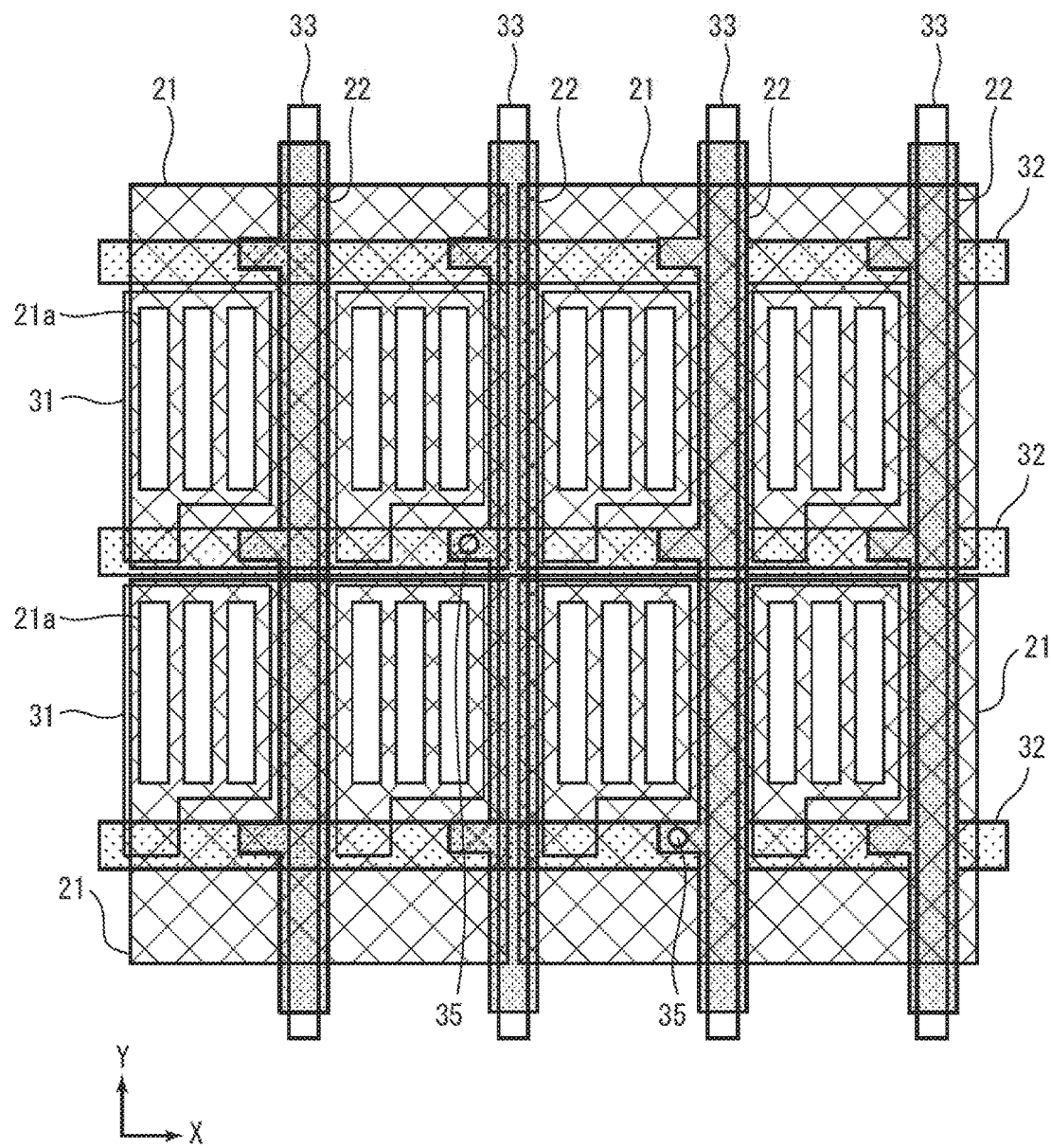
FIG. 3 is an enlarged view of a part of the area of the active matrix substrate.

FIG. 3 is an enlarged view of a part of the area of the active matrix substrate 1. As illustrated in FIG. 3, a plurality of pixel electrodes 31 are arranged in matrix. Further, though omitted in FIG. 3, thin film transistors (TFTs) as display control elements also arranged in matrix in correspondence to the pixel electrodes 31, respectively. The counter electrodes 21 are provided with a plurality of slits 21a.

Around the pixel electrodes 31, the gate lines 32 and the source lines 33 are provided. The gate line 32 extends in the X axis direction, and a plurality of the same are arrayed at predetermined intervals in the Y axis direction. The source line 33 extends in the Y axis direction, and a plurality of the same are arrayed at predetermined intervals in the X axis direction. In other words, the gate lines 32 and the source lines 33 are formed in a lattice form, and the pixel electrodes 31 are provided in the areas divided by the gate lines 32 and the source lines 33, respectively.

As illustrated in FIG. 3, the signal lines 22 extending in the Y axis direction are arranged so as to be partially superposed, in the normal direction with respect to the active matrix substrate 1, on the source lines 33 extending in the Y axis direction. More specifically, the signal lines 22 are provided in an upper layer with respect to the source lines 33, and when viewed in a plan view, the signal lines 22 and the source lines 33 are partially superposed on each other.

In FIG. 3, black circles 35 indicate portions at which the counter electrodes 21 and the signal lines 22 are connected with each other.

Figure 4:
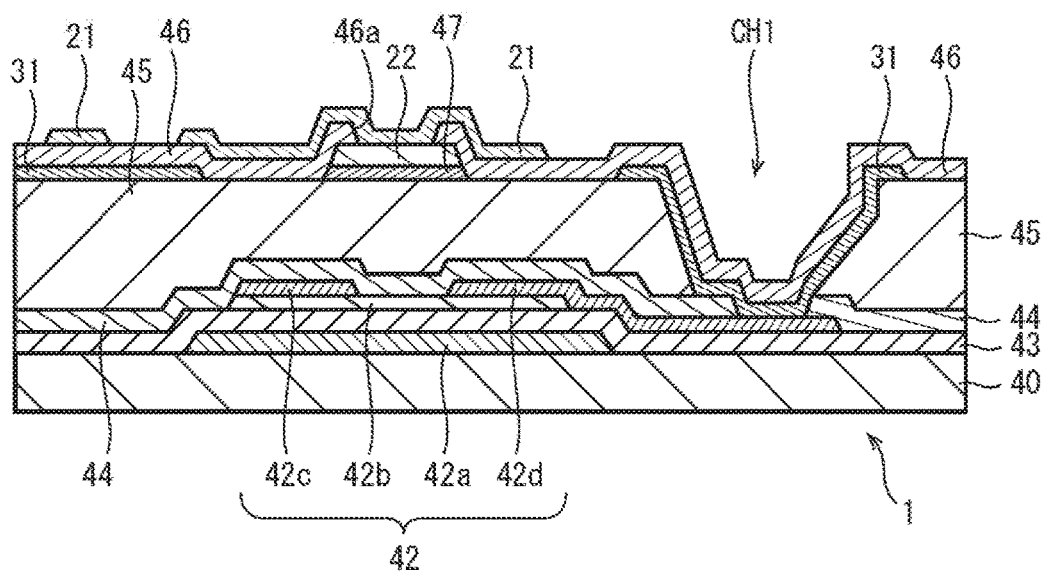
FIG. 4 is a cross-sectional view of the active matrix substrate at a position where a TFT is included.

FIG. 4 is a cross-sectional view of the active matrix substrate 1 at a position where the TFT 42 is included. On the glass substrate 40, the TFT 42 as a display control element is provided. The TFT 42 includes a gate electrode 42a, a semiconductor film 42b, a source electrode 42c, and a drain electrode 42d.

The gate electrode 42a of the TFT 42 is formed on the glass substrate 40. The gate electrode 42a is formed with, for example, a laminate film made of titanium (Ti) and copper (Cu). A gate insulating film 43 is formed so as to cover the gate electrode 42a. The gate insulating film 43 is made of, for example, silicon nitride (SiNx) or silicon dioxide ($SiO_2$).

On the gate insulating film 43, the semiconductor film 42b is formed. The semiconductor film 42b is, for example, an oxide semiconductor film, which may contain at least one metal element among In, Ga, and Zn. In the present embodiment, the semiconductor film 42b contains, for example, an In—Ga—Zn—O-based semiconductor. Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the ratio include In:Ga:Zn=2:2:1, In:Ga:Zn=1:1:1, and In:Ga:Zn=1:1:2.

The source electrode 42c and the drain electrode 42d are provided on the semiconductor film 42b so as to be distanced from each other. The source electrode 42c and the drain electrode 42d are formed with, for example, laminate films made of titanium (Ti) and copper (Cu).

A first insulating film 44 is formed so as to cover the source electrode 42c and the drain electrode 42d. The first insulating film 44 is made of, for example, silicon nitride ($SiN_x$) or silicon dioxide ($SiO_2$).

On the first insulating film 44, a flattening film 45, which is an insulator, is formed. The flattening film 45 is made of, for example, an acrylic resin material such as polyrnethyl methacrylate resin (PMMA). The flattening film 45, however, can be omitted.

On the flattening film 45, the pixel electrode 31 is formed. The pixel electrode 31 is a transparent electrode, and is made of a material such as, for example, indium tin oxide (ITO), zinc oxide (ZnO), indium zinc oxide (IZO), indium gallium zinc oxide (IGZO), or indium tin zinc oxide (ITZO).

On the flattening film 45, a conductive film 47 is formed as well. This conductive film 47 is a transparent electrode film made of the same material as that of the pixel electrode 31. The conductive film 47 is provided for a purpose of improving the adhesion between the signal line 22 and the flattening film 45. In a case where high adhesion is achieved between the signal line 22 and the flattening film 45, therefore, the conductive film 47 can be omitted.

On the conductive film 47, the signal line 22 is formed. The signal line 22 is made of, for example, any one of copper (Cu), titanium (Ti), molybdenum (Mo), aluminum (Al), magnesium (Mg), cobalt (Co), chromium (Cr), tungsten (W), and cadmium (Cd), or alternatively, a mixture of any of these. In a case where the conductive film 47 is omitted, the signal line 22 is formed on the flattening film 45.

A second insulating film 46 is formed so as to cover the pixel electrode 31 and the signal line 22. The second insulating film 46 is made of, for example, silicon nitride ($SiN_x$) or silicon dioxide ($SiO_2$).

On the second insulating film 46, the counter electrode 21 is formed. In the second insulating film 46, an opening 46a for allowing the counter electrode 21 and the signal line 22 to be connected with each other is provided. The counter electrode 21 is in contact with the signal line 22 at opening 46a portion in the second insulating film 46. The counter electrode 21 is a transparent electrode, made of a material such as, for example, ITO, ZnO, IZO, IGZO, or ITZO.

In the first insulating film 44 and the flattening film 45, a contact hole CH1 is formed. The pixel electrode 31 is in contact with the drain electrode 42d the TFT 42, through the contact hole CH1.

Here, since the signal line 22 is a line for transmitting a touch driving signal and a touch detection signal for detecting a touch position, unlike the gate line 32 and the source line 33 for transmitting a signal for image display, it is necessary to provide the signal line 22 in a layer different from the layer where the TFT 42 is provided. If the signal line 22 is provided in an upper layer with respect to the counter electrode 21, there is a possibility that a displayed image could be influenced (display noises could occur) during the control for touch position detection, since the liquid crystal layer 3 exists above the counter electrode 21. In the present embodiment, however, as illustrated FIG. 4, the signal line 22 is provided in a layer upper with respect to the TFT 42 and lower with respect to the counter electrode 21, which enables to suppress influences to a displayed image during the control for touch position detection.

Further, in a case where signal lines are added to a configuration of a conventional liquid crystal display device, adding the signal lines under the pixel electrodes can be considered. In this case, it is necessary to laminate the signal lines, an insulating film, the pixel electrodes, an insulating film, and the counter electrodes in the stated order from the lower side, and thus, two insulating films are needed. In the present embodiment, however, the signal lines 22 are formed in the same layer as the pixel electrodes 31 (to be exact, the pixel electrodes 31 and the conductive film 47 are in the same layer, and the signal lines 22 are in a layer above the conductive film 47), and only one insulating film, i.e., the second insulating film 46, is needed, that insulates the pixel electrodes 31 and the signal lines 22 from the counter electrodes 21.

Figure 5:
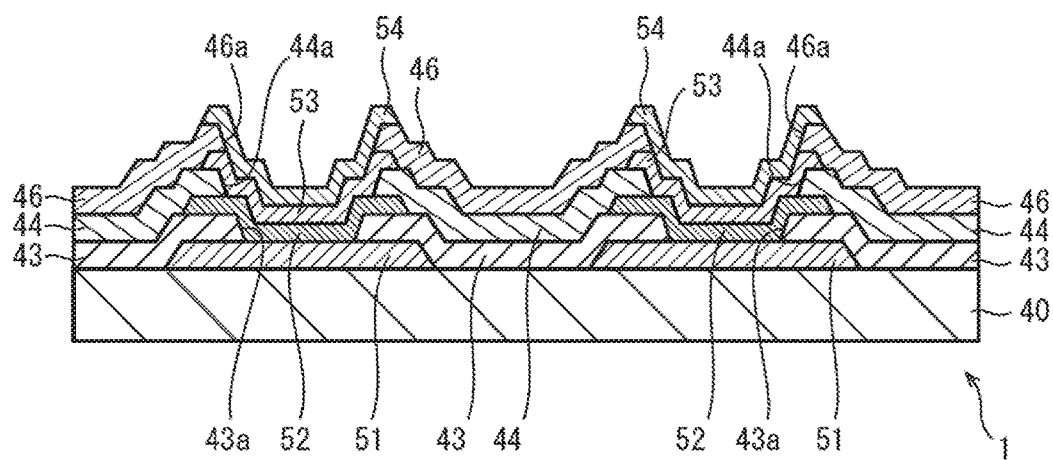
FIG. 5 is a cross-sectional view of a terminal part of a controller connected with the active matrix substrate.

FIG. 5 is a cross-sectional view of a terminal part of the controller 20 connected with the active matrix substrate 1. The terminal part of the controller 20 includes gate terminals connected with the gate lines 32, and source terminals connected with the source lines 33.

On the glass substrate 40, first metal films 51 are formed. The first metal films 51 are metal films used when the gate lines 32 and the gate electrodes 42a are formed. The gate insulating film 43 is formed so as to cover the first metal films 51. In the gate insulating film 43, openings 43a are provided.

In each area that includes the opening 43a of the gate insulating film 43 and a peripheral area around the opening 43a, a second metal film 52 is formed. The second metal films 52 are metal films used when the source lines 33 and the source electrodes 42c are formed. Each second metal film 52 is in contact with the first metal film 51 through the opening 43a of the gate insulating film 43.

On the cross section of the gate terminal included in the terminal part, the first metal film 51 forms the gate line 32, but the second metal film 52 does not form the source line 33. More specifically, the second metal films 52 in the terminal part are formed in the process in which the source lines 33 and the source electrodes 42c are formed, but are electrically insulated from the source lines 33 and the source electrodes 42c.

On the other hand, on the cross section of the source terminal included in the terminal part, the second metal film 52 forms the source line 33, but the first metal film 51 does not form the gate line 32. More specifically, the first metal films 51 in the terminal part are formed in the process in which the gate lines 32 and the gate electrodes 42a are formed, but are electrically insulated from the gate lines 32 and the gate electrodes 42a.

On the second metal films 52 and the gate insulating film 43, the first insulating film 44 is formed. In the first insulating film 44, openings 44a are provided.

In each area that includes the opening 44a of the first insulating film 44 and a peripheral area around the opening 44a, a first transparent electrode film 53 is formed. The first transparent electrode films 53 are electrode films used when the pixel electrodes 31 and the conductive films 47 are formed, and are electrically insulated from the pixel electrodes 31. Each first transparent electrode film 53 is in contact with the second metal film 52 through the opening 44a of the first insulating film 44.

On the first transparent electrode films 53 and the first insulating film 44, the second insulating film 46 is provided. In the second insulating film 46, openings 46a are provided.

In each area that includes the opening 46a of the second insulating film 46 and a peripheral area around the second insulating film 46, a second transparent electrode film 54 is formed. The second transparent electrode films 54 are electrode films used when the counter electrodes 21 are formed, and are electrically insulated from the counter electrodes 21. Each second transparent electrode film 54 is in contact with the first transparent electrode film 53 through the opening 46a of the second insulating film 46.

In other words, in the terminal part of the controller 20, the following are laminated in the stated order on the active matrix substrate 1: the first metal film 51 made of the same material as a material of the gate line 32; the second metal film 52 made of the same material as a material of the source line 33; the first transparent electrode film 53 made of the same material as a material of the pixel electrode 31; and the second transparent electrode film 54 made of the same material as a material of the counter electrode 21. In other words, no metal film made of the same material as the material of the signal line 22 is laminated, and therefore, steps at the laminate can be made smaller, whereby the breaking of the line can be suppressed.

In the present embodiment, the signal lines 22 connected with the counter electrodes 21 are connected with the controller 20 in an area between the controller 20 and the counter electrodes 21 closest to the controller 20, through the second metal films 52 and the first metal films 51. In other words, in the area between the controller 20 and the counter electrodes 21 closest to the controller 20, there is a connection part that is connected with the first metal films that are used when the gate lines 32 and the gate electrodes 42a are formed, and the second metal films that are used when the source lines 33 and the source electrodes 42c are formed, and in this connection part, the signal lines 22 are electrically connected with the first metal films and the second metal films.

In the present embodiment, the counter substrate is not present in the area where the controller 20 is provided. Accordingly, if the configuration is such that the signal lines 22 are directly connected to the controller 20, the second insulating film 46 is the only insulating film that protects the signal lines 22, and there is concern that the signal lines 22 could erode in such an area where the counter substrate is not present. As described above, however, if the signal lines 22 are reconnected so as to be electrically connected with the first metal film and the second metal film in the connection part, the concern of erosion of the signal line 22 in an area where the counter substrate is not present can be reduced, since the first metal film and the second metal film are protected by the first insulating film 44 and the second insulating film 46.

Figure 6:
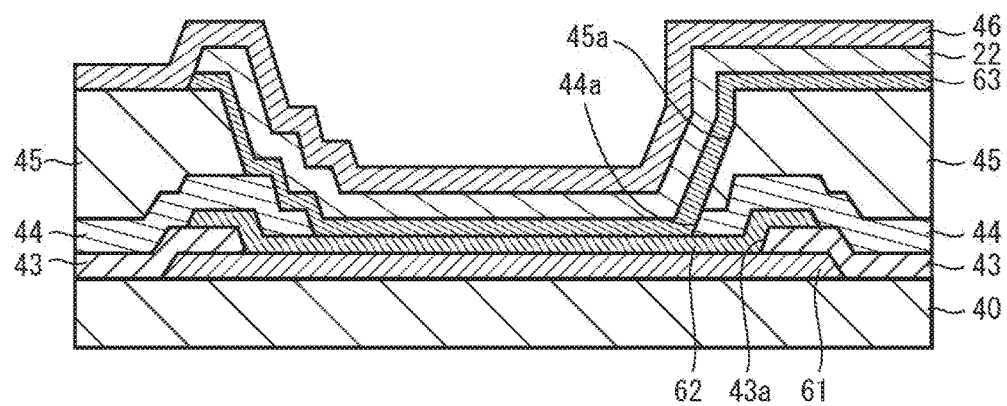
FIG. 6 is a cross-sectional view illustrating a connection part to which a first metal film and a second metal film are connected in an area between the controller and the counter electrode closest to the controller.

FIG. 6 is a cross-sectional view of the above-described connection part. In this connection part, a first metal film 61 is formed on the glass substrate 40. The first metal film 61 is a metal film that is used when the gate lines 32 and the gate electrodes 42a are formed, and is formed in the process in which the gate lines 32 and the gate electrodes 42a are formed, as is the case with the first metal film 51 illustrated in FIG. 5. The first metal film 61, however, is denoted by a reference numeral different form the first metal film 51 illustrated in FIG. 5, since it is not electrically connected with the first metal film 51 illustrated in FIG. 5.

The gate insulating film 43 is formed so as to cover the first metal film 61. The openings 43a are provided in the gate insulating film 43.

In each area that includes the opening 43a of the gate insulating film 43 and a peripheral area around the opening 43a, a second metal film 62 is formed. The second metal film 62 is a metal film used when the source lines 33 and the source electrodes 42c are formed, and is formed in the process in which the source lines 33 and the source electrodes 42c are formed, as is the case with the second metal films 52 illustrated in FIG. 5. The second metal film 62, however, is denoted by a reference numeral different form the second metal film 62 illustrated in FIG. 5, since it is not electrically connected with the second metal film 62 illustrated in FIG. 5. The second metal film 62 is in contact with the first metal film 61 through the opening 43a of the gate insulating film 43.

On the second metal film 62 and the gate insulating film 43, the first insulating film 44 is formed. In the first insulating film 44, the openings 44a are provided.

On the first insulating film 44, the flattening film 45 is formed. In the flattening film 45, the openings 45a are provided.

In each area that includes the opening 44a of the first insulating film 44 and the opening 45a of the flattening film 45 and a peripheral area around the openings 44a and 45a, a first transparent electrode film 63 is formed. The first transparent electrode film 63 is an electrode film used when the pixel electrodes 31 and the conductive films 47 are formed, and are formed in the process in which the pixel electrodes 31 and the conductive films 47 are formed, as is the case with the first transparent electrode films 53 illustrated in FIG. 5. The first transparent electrode film 63, however, is denoted by a reference numeral different form the first transparent electrode film 53 illustrated in FIG. 5, since it is not electrically connected with the first transparent electrode film 53 illustrated in FIG. 5. The first transparent electrode film 63 is electrically insulated also from the pixel electrodes 31. The first transparent electrode film 63 is in contact with the second metal film 62, through the opening 44a of the first insulating film 44 and the opening 45a of the flattening film 45.

On the first transparent electrode film 63, the signal lines 22 are formed. On the signal lines 22, the second insulating film 46 is provided.

The signal line 22 is electrically connected with the first metal film 61 and the second metal film 62 via the first transparent electrode film 63. The first metal film 61 and second metal film 62 are electrically connected with the controller 20. In other words, the touch driving signal output from the controller 20 is transmitted to the connection part through the first metal film 61 and the second metal film 62, and is transmitted to the signal line 22 in the connection part, thereby being supplied to the counter electrode 21.

According to the present embodiment, the signal line 22 is connected with the first metal film 61 and the second metal film 62 via the first transparent electrode film 63, in the connection part to which the first metal film 61 and the second metal film 62 are connected. This makes it possible to reduce the resistance in the connection part. Accordingly, this makes it possible to suppress a decrease in the signal level when the touch driving signal and the touch detection signal are transmitted/received to/from the signal lines 22 via the connection part.

The configuration, however, can be such that the length of the signal line 22 is set so that the signal line 22 extending from the counter electrode 21 toward the connection part does not reach the connection part, and the signal line 22 are omitted in the cross-sectional view of the connection part. In this case, in the connection part, the first transparent electrode film 63 electrically connected with the signal line 22 is connected with the first metal film 61 and the second metal film 62, which means that the configuration is such that the signal line 22 is electrically connected with the first metal film 61 and the second metal film 62 through the first transparent electrode film 63.

FIGS. 7A-7E, 8A-8D and 9A-9E are diagrams for explaining a process for manufacturing the touch-panel-equipped display device 10 in Embodiment 1. In each of FIGS. 7A-7E, 8A-8D and 9A-9E, from left to right, cross-sections of an area where the TFT 42 is provided (hereinafter referred to as a "TFT area"), cross-sections of the terminal part of the controller 20 (hereinafter referred to as a "terminal part area"), and cross-sections of the connection part (hereinafter referred to as a "connection part area") are illustrated.

Figure 7:
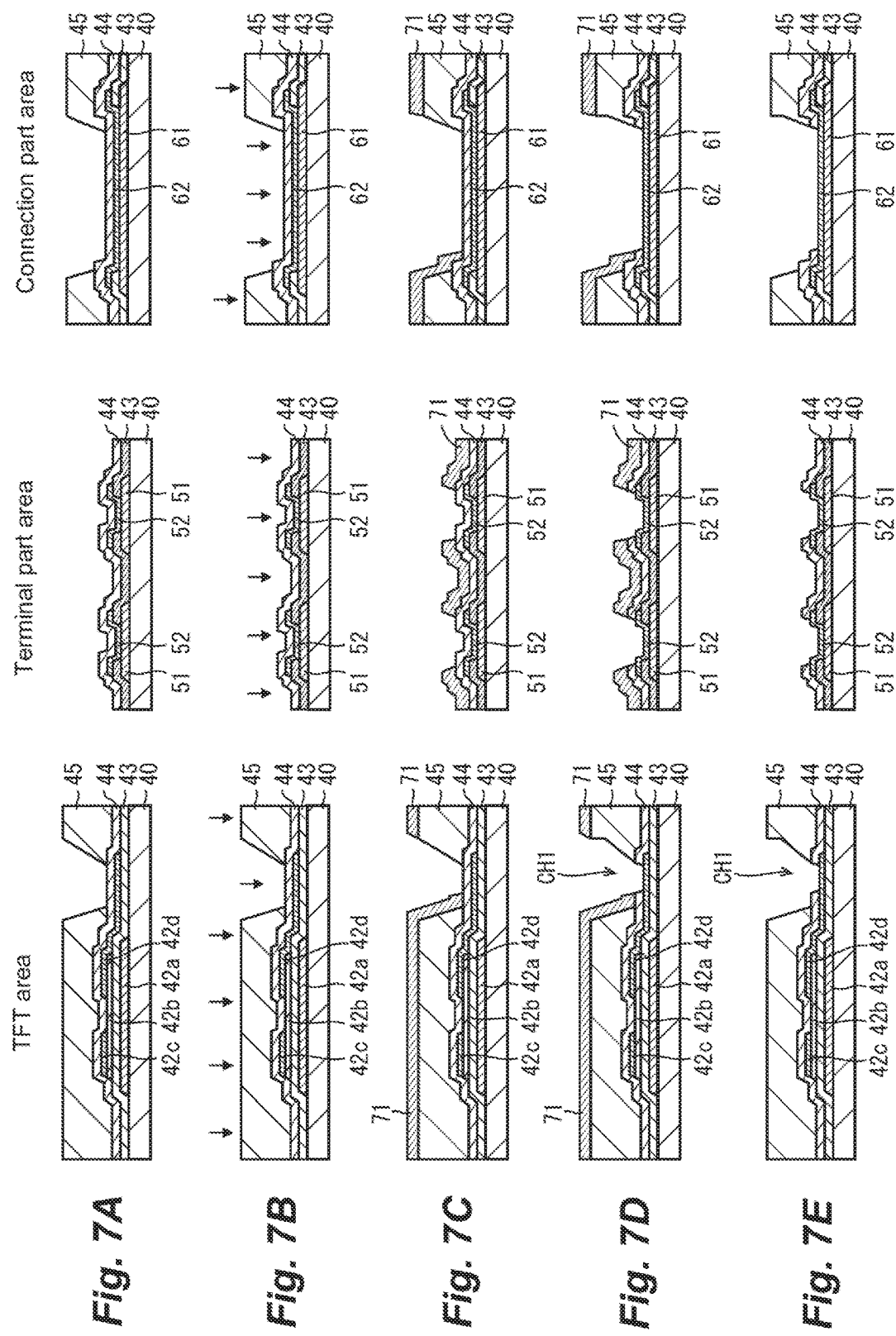
FIGS. 7A-7E are diagrams for explaining a process for manufacturing the touch-panel-equipped display device according to Embodiment 1.

In the TFT area, the TFT 42 is formed on the glass substrate 40 by a known method. FIG. 7A illustrates a state in which the TFT 42 is formed on the glass substrate 40 by a known method, and the first insulating film 44 and the flattening film 45 are formed on the TFT 42. In the flattening film 45, a hole for forming a contact hole CH1 through which the pixel electrode 31 and the drain electrode 42*d* of the TFT 42 are to be connected with each other is formed.

In the terminal part area, the first metal film 51, the gate insulating film 43, the second metal film 52, and the first insulating film 44 are laminated in this order on the glass substrate 40, as illustrated in FIG. 7A. In the connection part area, the first metal film 61, the gate insulating film 43, the second metal film 62, the first insulating film 44, and the flattening film 45 are laminated in this order on the glass substrate 40, as illustrated in FIG. 7A.

In the state illustrated in FIG. 7A, plasma treatment using nitrogen gas or oxygen gas is performed with respect to exposed surfaces (see FIG. 7B). In other words, in the TFT area, plasma treatment is performed with respect to exposed surfaces of the first insulating film 44 and the flattening film 45. In the terminal part area, plasma treatment is performed with respect to an exposed surface of the first insulating film 44. In the connection part area, plasma treatment is performed with respect to exposed surfaces of the first insulating film 44 and the flattening film 45. By performing plasma treatment, fine protrusions and recesses can be formed on the smooth surfaces (surface roughening), which improves adhesion when the transparent electrode film is formed in a later step.

Next, in the TFT area and the connection part area, a mask 71 made of photoresist is formed on the surface of the flattening film 45 (see FIG. 7C). In the terminal part area, the flattening film 45 is not provided, and hence, a mask 71 made of photoresist is formed on the first insulating film 44.

Subsequently, in the TFT area, a portion of the first insulating film 44 that is not covered with the mask 71 is subjected to dry etching, whereby the contact hole CH1 is formed (see FIG. 7D). In the terminal part area, a portion of the first insulating film 44 that is not covered with the mask 71 is subjected to dry etching, whereby the second metal film 52 is exposed (see FIG. 7D). In the connection part area, the portion of the first insulating film 44 that is not covered with the mask 71 is subjected to dry etching, whereby the second metal film 62 is exposed (see FIG. 7D).

Subsequently, the mask 71 is stripped off (see FIG. 7E).

Figure 8:
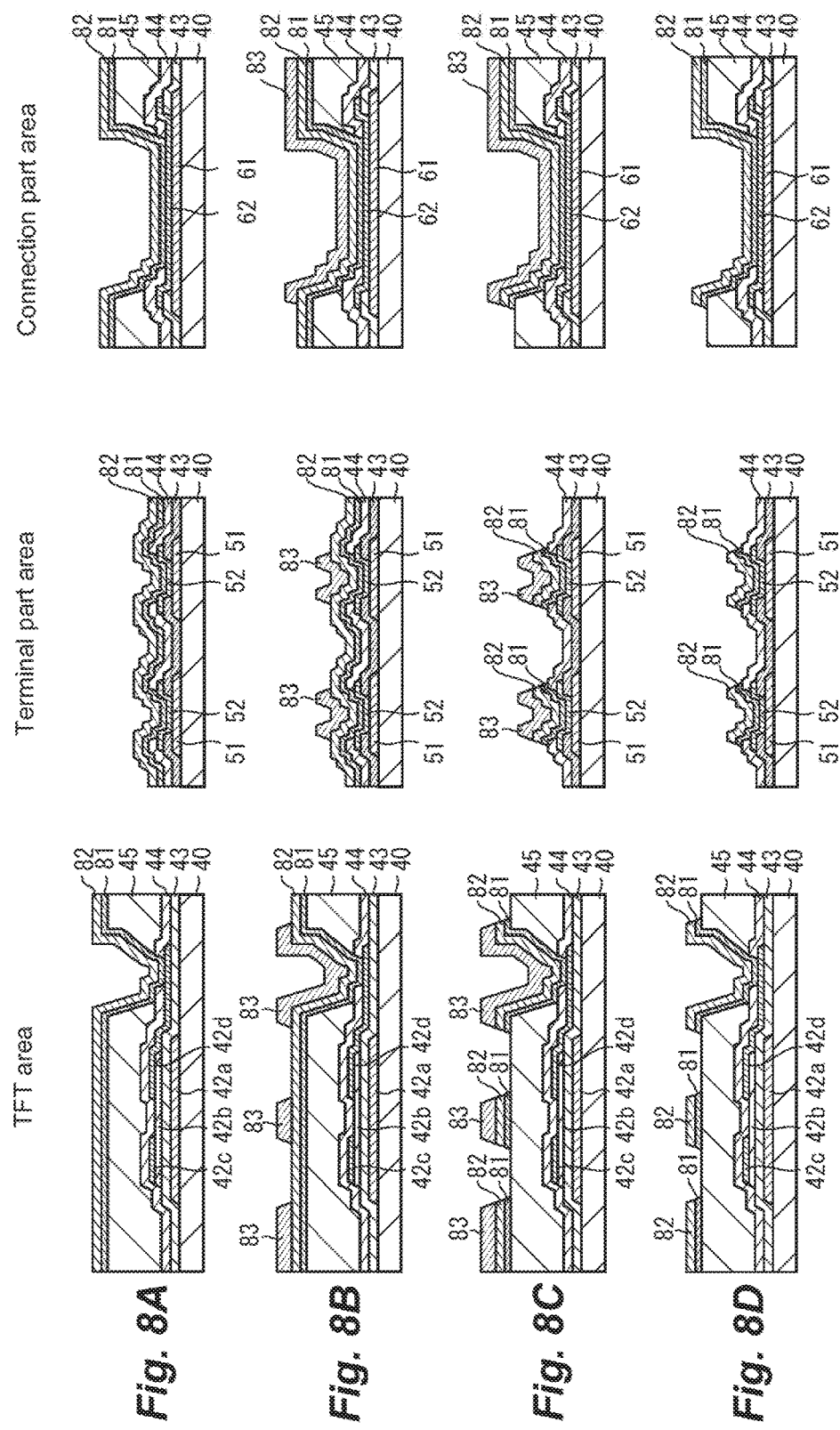
FIGS. 8A-8D are diagrams for explaining the process for manufacturing the touch-panel-equipped display device according to Embodiment 1, illustrating a step following to the step illustrated in FIG. 7E.

Subsequently, a transparent electrode film 81 for forming the pixel electrode 31, the conductive film 47, the first transparent electrode film 53, and the first transparent electrode film 63 is formed, and a metal film 82 for forming the signal line 22 is formed on the transparent electrode film 81 (see FIG. 8A). The transparent electrode film 81 has a thickness of, for example, 10 nm to 100 nm. Further, the metal film 82 has a thickness of, for example, 50 nm to 300 nm.

Subsequently, a mask 83 made of photoresist is formed on the metal film 82 (see FIG. 8B). The mask 83 is formed in areas where the pixel electrodes 31 are to be formed, and areas where the signal lines 22 are to be formed. Subsequently, portions of the transparent electrode film 81 and the metal film 82 in areas that are not covered with the mask 83 are subjected to wet etching (see FIG. 8C). Then, the mask 83 is stripped off (see FIG. 8D).

Figure 9:
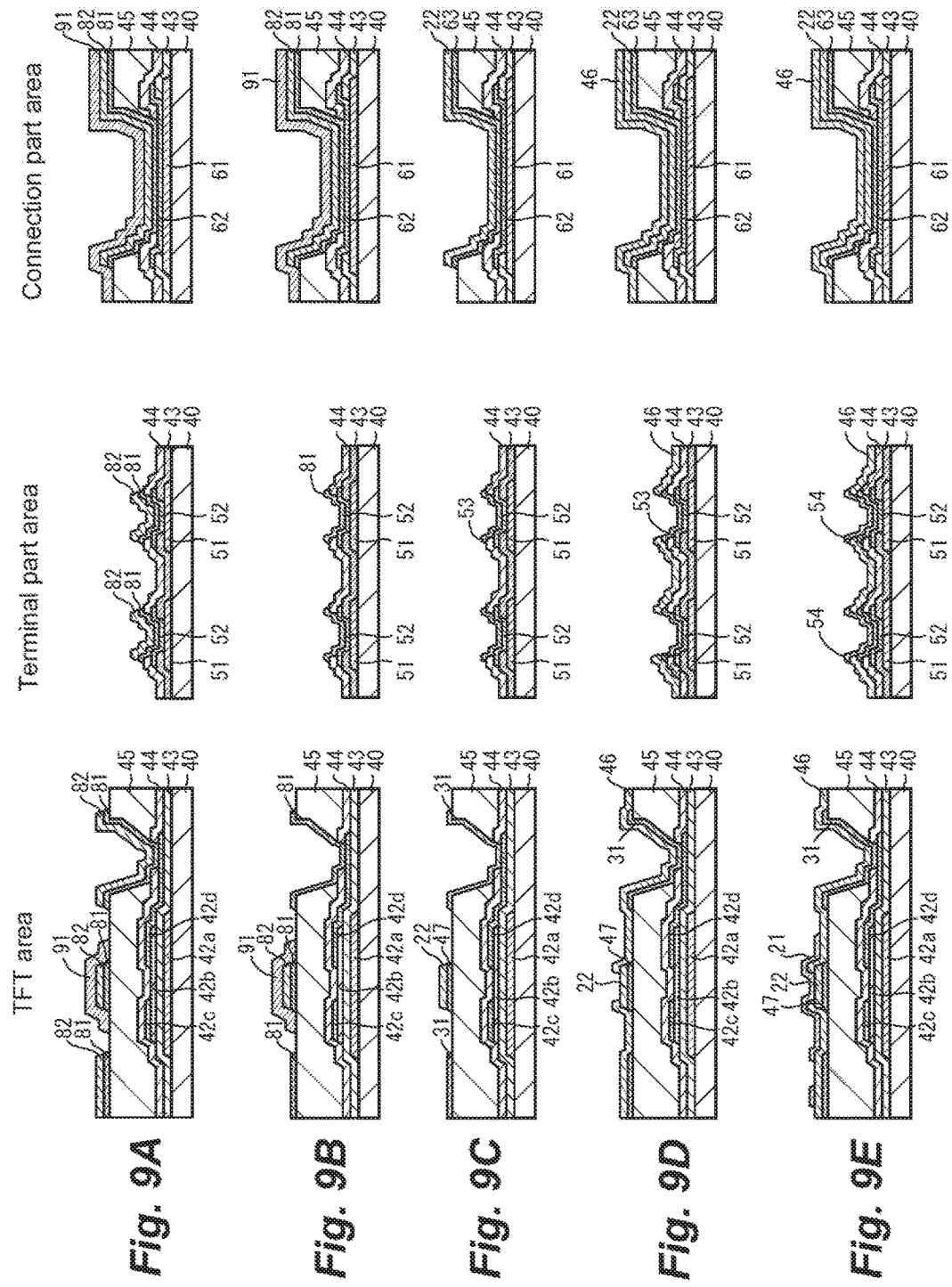
FIGS. 9A-9E are diagrams for explaining the process for manufacturing the touch-panel-equipped display device according to Embodiment 1, illustrating a step following to the step illustrated in FIG. 8D.

Next, a mask 91 made of photoresist is formed on the metal films 82 that are to become the signal lines 22, among areas where the metal films 82 are formed (see FIG. 9A). Then, portions of the metal films 82 that are not covered with the mask 91 are removed by wet etching (see FIG. 9B). Thereafter, the mask 91 is stripped off (see FIG. 9C). Through this process, in the TFT area, the pixel electrode 31, the conductive film 47, and the signal line 22 are formed. Further, in the terminal part area, the first transparent electrode film 53 is formed. Still further, in the connection part area, the first transparent electrode film 63 and the signal line 22 are formed.

Subsequently, the second insulating film 46 is formed. Here, in the TFT area, the second insulating film 46 is subjected to dry etching so that a part of an upper part of the signal line 22 becomes exposed, and in the terminal part area, the second insulating film 46 is subjected to dry etching so that a part of the first transparent electrode film 53 is exposed (see FIG. 9D).

Then, transparent electrode films for forming the counter electrodes 21 and the second transparent electrode films 54 are formed (see FIG. 9E). In the TFT area, the transparent electrode films are formed so that the counter electrode 21 is in contact with the signal line 22, and in the terminal part area, the transparent electrode films are formed so that the second transparent electrode films 54 are in contact with the first transparent electrode films 53.

The configuration of the touch-panel-equipped display device 10 in the present embodiment can be varied in many ways.

Modification Example 1

Figure 10:
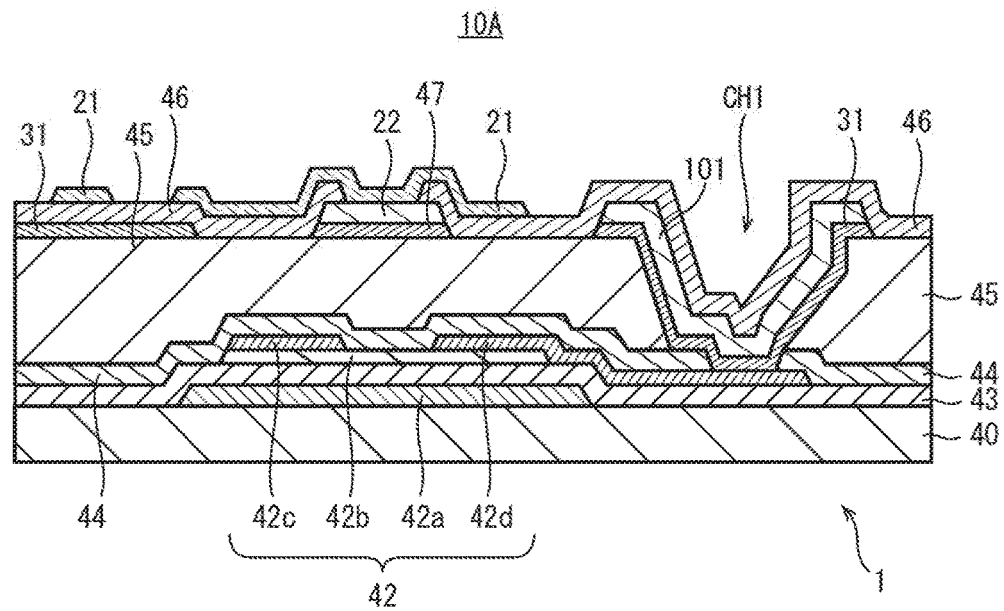
FIG. 10 is a cross-sectional view illustrating an active matrix substrate in a touch-panel-equipped display device in a configuration of Modification Example 1, taken at a position where a TFT is included.

FIG. 10 is a cross-sectional view illustrating an active matrix substrate 1 in a touch-panel-equipped display device 10A in a configuration of Modification Example 1, taken at a position where a TFT is included. In the configuration of Modification Example 1, as illustrated in FIG. 10, in a portion where the drain electrode 42*d* of the TFT 42 and the pixel electrode 31 are connected through the contact hole CH1, a metal film 101 that is made of the same material as a material that forms the signal line 22 is provided between the pixel electrode 31 and the second insulating film 46. In other words, in a portion where the contact hole CH1 is provided, the metal film 101, which is the same metal film as the metal film that forms the signal line 22, is provided on the pixel electrode 31. This makes it possible to, for example, prevent the pixel electrode 31 from being damaged by etching in a step of forming the counter electrodes 21.

To achieve the configuration of Modification Example 1, the following may be performed in the step illustrated in FIG. 9A, in the manufacturing process explained with reference to FIGS. 7A-7E, 8A-8D and 9A-9E; not only on the metal films 82 that are to become the signal lines 22, but also on the metal films 82 that are formed on portions where the contact holes CH1 are formed, the mask 91 made of photoresist is formed, and next, portions of the metal films 82 that are not covered with the mask 91 are removed by wet etching.

Modification Example 2

Figure 11:
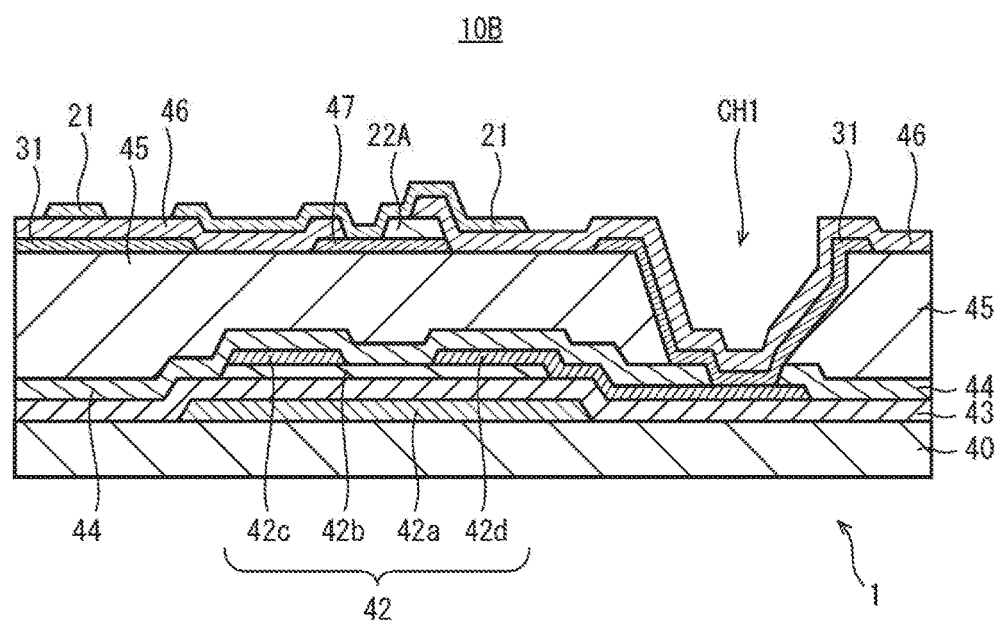
FIG. 11 is a cross-sectional view illustrating an active matrix substrate in a touch-panel-equipped display device in a configuration of Modification Example 2, taken at a position where a TFT is included.

FIG. 11 is a cross-sectional view illustrating an active matrix substrate 1 in a touch-panel-equipped display device 10B in a configuration of Modification Example 2, taken at a position where a TFT is included. In the configuration of Modification Example 2, as illustrated in FIG. 11, the signal line 22A has a line width smaller than that of the signal line 22 illustrated in FIG. 4.

More specifically, in the configuration illustrated in FIG. 4, each signal line 22 is in contact with the second insulating film 46 in such a manner that portions of the top surface (surface on the counter electrodes 21 side) of the signal line 22 on both sides of the area in contact with the counter electrode 21 are in contact with the second insulating film 46. On the other hand, in the configuration illustrated in FIG. 11, the signal line 22 is in contact with the second insulating film 46 in such a manner that a portion of the top surface of the signal line 22 only on one side of the area in contact with the counter electrodes 21 is in contact with the second insulating film 46.

For example, in a case where the adhesion between the signal line 22 and the second insulating film 46 is poor, the configuration may be such that, as illustrated in FIG. 11, the signal line 22 is in contact with the second insulating film 46 not on both sides thereof, but on one side thereof alone, whereby the superficial area of the interface between the signal line 22 and the second insulating film 46 decreases. As a result, the adhesion improves.

Modification Example 3

Figure 12:
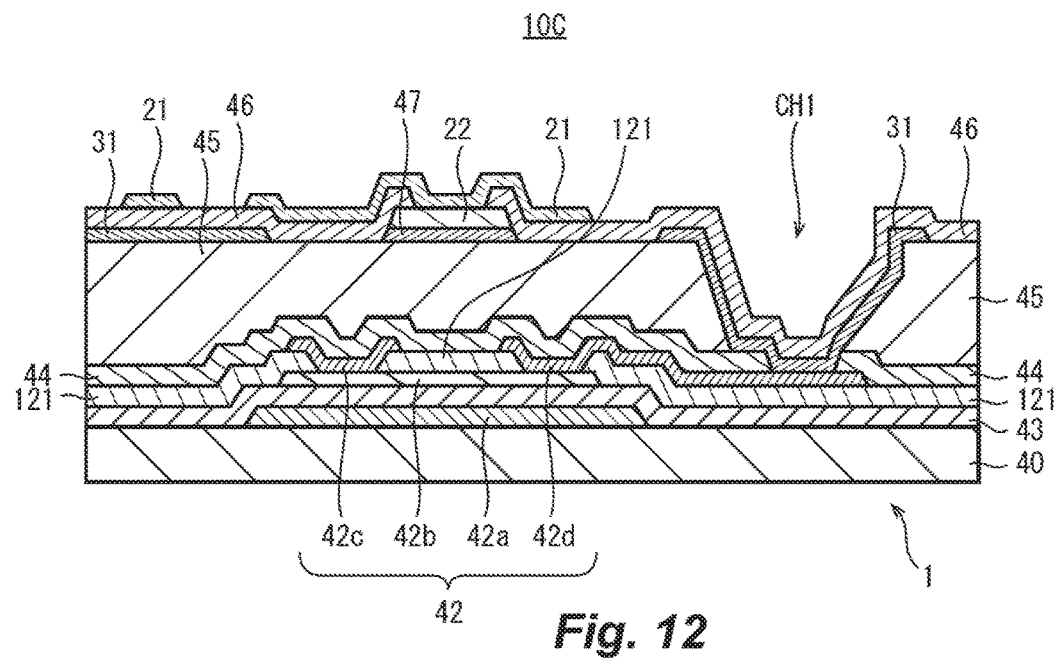
FIG. 12 is a cross-sectional view illustrating an active matrix substrate in a touch-panel-equipped display device in a configuration of Modification Example 3, taken at a position where a TFT is included.

FIG. 12 is a cross-sectional view illustrating an active matrix substrate 1 in a touch-panel-equipped display device 10C in a configuration of Modification Example 3, taken at a position where a TFT is included. In the configuration of Modification Example 3, an etching stopper layer 121 is provided on the semiconductor film 42b of the TFT 42, between the source electrode 42c and the drain electrode 42d. The etching stopper layer 121 thus provided makes it possible to prevent the semiconductor film 42b from being damaged by etching that is performed when the source electrode 42c or the drain electrode 42d is formed.

Modification Example 4

Figure 13:
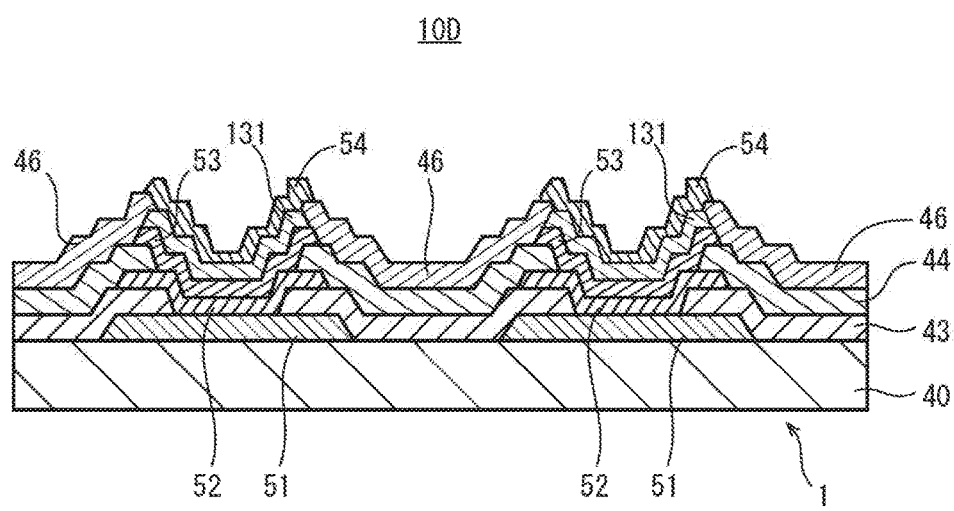
FIG. 13 is a cross-sectional view illustrating a terminal part of a controller connected with an active matrix substrate in a touch-panel-equipped display device in a configuration of Modification Example 4.

FIG. 13 is a cross-sectional view illustrating a terminal part of a controller 20 connected with an active matrix substrate 1 in a touch-panel-equipped display device 10D in a configuration of Modification Example 4. In the configuration of Modification Example 4, a metal film 131 made of the same material as that of the metal film forming the signal line 22 is provided between the first transparent electrode film 53 and the second transparent electrode film 54, in the terminal part of the controller 20.

In other words, in the terminal part of the controller 20, the first metal film 51 made of the same material as a material of the gate line 32, the second metal film 52 made of the same material as a material of the source line 33, the first transparent electrode film 53 made of the same material as a material of the pixel electrode 31, a metal film 131 made of the same material as a material of the signal line 22, and the second transparent electrode film 54 made of the same material as a material of the counter electrode 21, are laminated sequentially in the stated order on the active matrix substrate 1. According to this configuration, the metal film 131 is provided in the terminal part, whereby the resistance of the terminal part can be decreased.

To achieve this configuration of Modification Example 4, a mask 91 made of photoresist may be formed on the metal films 82 in the terminal part area, in the step illustrated in FIG. 9A, in the manufacturing process explained with reference to FIGS. 7A-7E, 8A-8D and 9A-9E. By doing so, the metal films 82 on the first transparent electrode films 53 are not removed by wet etching in a later step. The metal film 131 therefore can be formed between the first transparent electrode film 53 and the second transparent electrode film 54.

The above-described embodiments and modification examples are merely examples for implementing the present invention. The present invention, therefore, is not limited by the above-described embodiments and modification examples, and the above-described embodiments can be appropriately varied and implemented without departing from the spirit and scope of the invention.

For example, the TFT 42 is not limited to the TFT of the bottom gate type, but may be a TFT of the top gate type. Further, the semiconductor film 32b does not have to be an oxide semiconductor film, but may be an amorphous silicon film.

In the manufacturing process illustrated in FIGS. 7A-7E, 8A-8D and 9A-9E, plasma treatment is performed (see FIG. 7B), after the TFT 42 is formed o the glass substrate 40 and the first insulating film 44 and the flattening film 45 are formed thereon (see FIG. 7A), and before the mask 71 is arranged (see FIG. 7C). The timing of performing the plasma treatment, however, is not limited to the above-described timing; the plasma treatment may be performed after the mask 71 is stripped off (see FIG. 7E), and before the transparent electrode film 81 and the metal film 82 are formed (see FIG. 8A).

DESCRIPTION OF REFERENCE NUMERALS

1: active matrix substrate
2: counter substrate
3: liquid crystal layer
10, 10A, 10B, 100, 10D: touch-panel-equipped display device
21: counter electrode
22, 22A: signal line
31: pixel electrode
42: TFT (display control element)
42a: gate electrode
42b: semiconductor film
42c: source electrode
42d: drain electrode
43: gate insulating film
44: first insulating film
45: flattening film
46: second insulating film
47: conductive film
101: metal film
131: metal film

The invention claimed is:
1. A touch-panel-equipped display device comprising:
an active matrix substrate;
a counter substrate opposed to the active matrix substrate;
a liquid crystal layer interposed between the active matrix substrate and the counter substrate;
a display control element formed on the active matrix substrate;
a first insulating film formed on the active matrix substrate, on a liquid crystal layer side with respect to the display control element;
a plurality of pixel electrodes formed on the active matrix substrate, on a liquid crystal layer side with respect to the first insulating film;
a second insulating film formed on the active matrix substrate, on a liquid crystal layer side with respect to the pixel electrodes;
a plurality of counter electrodes formed on the active matrix substrate, on a liquid crystal layer side with respect to the second insulating film, the counter elec- trodes and the pixel electrodes having electrostatic capacitances therebetween;

a control unit provided on the active matrix substrate, the control unit detecting a touch position by supplying a touch driving signal to the counter electrodes; and signal lines for connecting the control unit and the counter electrodes, and supplying the touch driving signal from the control unit to the counter electrodes, wherein the signal lines are formed on the active matrix substrate, between the first insulating film and the second insulating film, the touch-panel-equipped display device further comprising:

a gate line arranged on the active matrix substrate, the gate line extending in a first direction; and a source line arranged on the active matrix substrate, the source line extending in a second direction that is different from the first direction, wherein the control unit is provided on the active matrix substrate, the control unit being electrically connected with the gate line and the source line, and in a terminal part where the control unit is connected to the active matrix substrate, a first metal film made of the same material as a material of the gate line, a second metal film made of the same material as a material of the source line, a first transparent electrode film made of the same material as a material of the pixel electrodes, and a second transparent electrode film made of the same material as a material of the counter electrodes are laminated sequentially on the active matrix substrate.

2. The touch-panel-equipped display device according to claim 1, further comprising:

a conductive film provided between the signal lines and the first insulating film, the conductive film being made of the same material as a material of the pixel electrodes.

3. The touch-panel-equipped display device according to claim 1, wherein the display control element is a thin film transistor, and includes at least a gate electrode, a source electrode, and a drain electrode, at a position where the pixel electrode is in contact with the drain electrode, the touch-panel-equipped display device further comprising:

a metal film provided between the pixel electrode and the second insulating film.

4. The touch-panel-equipped display device according to claim 1, wherein the signal lines are in contact with the second insulating film in such a manner that only a portion of a counter electrode side surface of each of the signal lines, on one side of an area in contact with the counter electrode, is in contact with the second insulating film.

5. The touch-panel-equipped display device according to claim 1, further comprising:

a flattening film arranged on the active matrix substrate, between the first insulating layer and the pixel electrodes, wherein a surface of the flattening film is treated by plasma treatment.

6. The touch-panel-equipped display device according to claim 1, wherein, in a connection part in which the first metal film made of the same material as a material of the gate line, the second metal film made of the same material as a material of the source line, and the first transparent electrode film made of the same material as a material of the pixel electrodes are laminated sequentially, the signal lines are laminated on the first transparent electrode film, and the signal lines are electrically connected with the control unit through the first metal film or the second metal film.

7. A touch-panel-equipped display device comprising:

an active matrix substrate;

a counter substrate opposed to the active matrix substrate;

a liquid crystal layer interposed between the active matrix substrate and the counter substrate;

a display control element formed on the active matrix substrate;

a first insulating film formed on the active matrix substrate, on a liquid crystal layer side with respect to the display control element;

a plurality of pixel electrodes formed on the active matrix substrate, on a liquid crystal layer side with respect to the first insulating film;

a second insulating film formed on the active matrix substrate, on a liquid crystal layer side with respect to the pixel electrodes;

a plurality of counter electrodes formed on the active matrix substrate, on a liquid crystal layer side with respect to the second insulating film, the counter electrodes and the pixel electrodes having electrostatic capacitances therebetween;

a control unit provided on the active matrix substrate, the control unit detecting a touch position by supplying a touch driving signal to the counter electrodes; and signal lines for connecting the control unit and the counter electrodes, and supplying the touch driving signal from the control unit to the counter electrodes, wherein the signal lines are formed on the active matrix substrate, between the first insulating film and the second insulating film, the touch-panel-equipped display device further comprising:

a gate line arranged on the active matrix substrate, the gate line extending in a first direction; and a source line arranged on the active matrix substrate, the source line extending in a second direction that is different from the first direction, wherein the control unit is provided on the active matrix substrate, the control unit being electrically connected with the gate line and the source line, and in a terminal part where the control unit is connected to the active matrix substrate, a first metal film made of the same material as a material of the gate line, a second metal film made of the same material as a material of the source line, a first transparent electrode film made of the same material as a material of the pixel electrodes, a metal film made of the same material as a material of the signal lines, and a second transparent electrode film made of the same material as a material of the counter electrodes are laminated sequentially on the active matrix substrate.

8. The touch-panel-equipped display device according to claim 7, further comprising:

a conductive film provided between the signal lines and the first insulating film, the conductive film being made of the same material as a material of the pixel electrodes.

9. The touch-panel-equipped display device according to claim 7,
wherein the display control element is a thin film transistor, and includes at least a gate electrode, a source electrode, and a drain electrode,
at a position where the pixel electrode is in contact with the drain electrode, the touch-panel-equipped display device further comprising:
a metal film provided between the pixel electrode and the second insulating film.

10. The touch-panel-equipped display device according to claim 7,
wherein the signal lines are in contact with the second insulating film in such a manner that only a portion of a counter electrode side surface of each of the signal lines, on one side of an area in contact with the counter electrode, is in contact with the second insulating film.

11. The touch-panel-equipped display device according to claim 7, further comprising:
a flattening film arranged on the active matrix substrate, between the first insulating layer and the pixel electrodes,
wherein a surface of the flattening film is treated by plasma treatment.

12. The touch-panel-equipped display device according to claim 7,
wherein, in a connection part in which the first metal film made of the same material as a material of the gate line, the second metal film made of the same material as a material of the source line, and the first transparent electrode film made of the same material as a material of the pixel electrodes are laminated sequentially, the signal lines are laminated on the first transparent electrode film, and
the signal lines are electrically connected with the control unit through the first metal film or the second metal film.

13. A method for manufacturing a touch-panel-equipped display device that includes an active matrix substrate, a counter substrate opposed to the active matrix substrate, and a liquid crystal layer interposed between the active matrix substrate and the counter substrate, and that has a function of detecting a touch position, comprising:
forming a display control element on the active matrix substrate;
after the display control element is formed, forming a first insulating film so that the first insulating film covers the display control element;
after the first insulating film is formed, forming a flattening film so that the flattening film covers the first insulating film;
performing plasma treatment to an exposed surface after the flattening film is formed;
after the plasma treatment is performed, forming a transparent electrode film for forming pixel electrodes;
after the transparent electrode film is formed, forming a metal film for forming signal lines for supplying a touch driving signal;
after the metal film is formed, forming a second insulating film; and
after the second insulating film is formed, forming counter electrodes that are electrically connected with the signal lines,
wherein the transparent electrode film is formed at least in an area where the pixel electrodes are to be formed and an area where the signal lines are to be formed, and
the signal lines are formed by forming the metal film on the transparent electrode film formed in the area where the signal lines are to be formed.

14. The method for manufacturing a touch-panel-equipped display device according to claim 13,
wherein the display control element is a thin film transistor and includes at least a gate electrode, a source electrode, and a drain electrode,
the method for manufacturing a touch-panel-equipped display device further comprising:
forming a hole in the flattening film; and
at a position where the hole is formed in the flattening film, forming a hole in the first insulating film,
wherein, when forming the transparent electrode film for forming the pixel electrodes, the transparent electrode film is formed so that the pixel electrode formed is in contact with the drain electrode at the position where the hole in the flattening film and the hole in the first insulating film are formed.

15. A method for manufacturing a touch-panel-equipped display device that includes an active matrix substrate, a counter substrate opposed to the active matrix substrate, and a liquid crystal layer interposed between the active matrix substrate and the counter substrate, and that has a function of detecting a touch position, comprising:
forming a display control element on the active matrix substrate;
after the display control element is formed, forming a first insulating film so that the first insulating film covers the display control element;
after the first insulating film is formed, forming a flattening film so that the flattening film covers the first insulating film;
performing plasma treatment to an exposed surface after the flattening film is formed;
after the plasma treatment is performed, forming a transparent electrode film for forming pixel electrodes;
after the transparent electrode film is formed, forming a metal film for forming signal lines for supplying a touch driving signal;
after the metal film is formed, forming a second insulating film; and
after the second insulating film is formed, forming counter electrodes that are electrically connected with the signal lines,
wherein, when forming the transparent electrode film, the transparent electrode film is formed also in an area other than the area where the pixel electrodes are to be formed, and
when forming the metal film, the metal film is formed on the transparent electrode film, also in an area other than the area where the signal lines are to be formed,
the method for manufacturing a touch-panel-equipped display device further comprising:
forming a first mask in the area where the pixel electrodes are to be formed, and in the area where the signal lines are to be formed;
after the first mask is formed, removing a portion of the transparent electrode film and the metal film that is not covered with the first mask, by etching;
after the portion of the transparent electrode film and the metal film is removed, removing the first mask;
after the first mask is removed, forming a second mask in the area where the signal lines are to be formed;
after the second mask is formed, removing a portion of the metal film that is not covered with the second mask, by etching; and after the portion of the metal film is removed, removing the second mask, whereby the pixel electrodes are formed in the area where the pixel electrodes are to be formed, and the signal lines are formed in the area where the signal lines are to be formed.

16. The method for manufacturing a touch-panel-equipped display device according to claim 15, wherein the display control element is a thin film transistor and includes at least a gate electrode, a source electrode, and a drain electrode, the method for manufacturing a touch-panel-equipped display device further comprising:

forming a hole in the flattening film; and at a position where the hole is formed in the flattening film, forming a hole in the first insulating film, wherein, when forming the transparent electrode film for forming the pixel electrodes, the transparent electrode film is formed so that the pixel electrode formed is in contact with the drain electrode at the position where the hole in the flattening film and the hole in the first insulating film are formed.

\* \* \* \* \*